US012432968B2

United States Patent
Xie et al.

(10) Patent No.: US 12,432,968 B2
(45) Date of Patent: Sep. 30, 2025

(54) NANOWIRE SOURCE/DRAIN FORMATION FOR NANOSHEET DEVICE

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Kangguo Cheng, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 788 days.

(21) Appl. No.: 17/457,058

(22) Filed: Dec. 1, 2021

(65) Prior Publication Data

US 2023/0170422 A1   Jun. 1, 2023

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H10D 30/031* (2025.01);
(Continued)

(58) Field of Classification Search
CPC .......................... H10D 64/018; H10D 64/017
See application file for complete search history.

(56) References Cited

U.S. PATENT DOCUMENTS

| 8,097,515 B2 | 1/2012 | Bangsaruntip |
| 8,183,587 B2 | 5/2012 | Samuelson |

(Continued)

FOREIGN PATENT DOCUMENTS

| KR | 20090096704 A | 9/2009 |
| KR | 101631778 B1 | 6/2016 |
| WO | 2023/099336 A1 | 6/2023 |

OTHER PUBLICATIONS

Notification of Transmittal of the International Search Report and the Written Opinion of the International Searching Authority, or the Declaration, date of mailing Mar. 15, 2023, International application No. PCT/EP2022/083169, 15 pages.

(Continued)

*Primary Examiner* — Alexander G Ghyka
(74) *Attorney, Agent, or Firm* — Samuel A. Waldbaum

(57) ABSTRACT

A method including forming a plurality of nanosheets on a substrate and forming a plurality of sacrificial layers on the substrate, wherein the plurality of nanosheets and the plurality of sacrificial layers are arranged as alternating layers. Forming and patterning a first hardmask located on top of one of the sacrificial layers and forming a second hardmask around the first hardmask. Patterning the plurality of nanosheets and the plurality of sacrificial layers. Forming and patterning a dummy gate located on top of first hard mask. Removing the plurality of sacrificial layers. Forming a plurality of nanowires, where the plurality of nanowires is formed by the removal of the plurality of sacrificial layers, where the removal of the plurality of sacrificial layers thins sections of each of the plurality of nanowires forming the plurality of nanowires.

19 Claims, 23 Drawing Sheets

(51) Int. Cl.
*H10D 30/01* (2025.01)
*H10D 62/10* (2025.01)
*H10D 64/01* (2025.01)

(52) U.S. Cl.
CPC ..... *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01)

(56) References Cited

U.S. PATENT DOCUMENTS

| | | | |
|---|---|---|---|
| 9,608,063 | B2 | 3/2017 | Hashemi |
| 9,754,840 | B2 | 9/2017 | Lin |
| 9,847,390 | B1 | 12/2017 | Xie |
| 9,905,643 | B1 | 2/2018 | Bergendahl |
| 9,953,979 | B2 | 4/2018 | Xu |
| 10,586,853 | B2 | 3/2020 | Leobandung |
| 10,804,398 | B2 | 10/2020 | Frougier |
| 2016/0254348 | A1 | 9/2016 | Bhuwalka |
| 2018/0269305 | A1 | 9/2018 | Bao et al. |
| 2019/0157386 | A1* | 5/2019 | Ando ............... H01L 21/02546 |
| 2019/0326395 | A1 | 10/2019 | Ando |
| 2020/0091288 | A1 | 3/2020 | Lee |
| 2020/0295002 | A1 | 9/2020 | Snyder |
| 2021/0066291 | A1 | 3/2021 | Lin |
| 2021/0296304 | A1 | 9/2021 | Liaw |

OTHER PUBLICATIONS

Yoon et al., "Gate-All-Around FETs: Nanowire and Nanosheet Structure", Nanowires-Recent Progress, IntechOpen, Oct. 2020, 17 pages.

* cited by examiner

NANOWIRE SOURCE/DRAIN FORMATION FOR NANOSHEET DEVICE

BACKGROUND

The present invention generally relates to the field of nano devices, and more particularly forming a nanosheet device with nanowired source/drain region to increase the source/drain contact area for the nanosheet device.

The source/drain epitaxy formation of a nanosheet transistor could generate defects. The epitaxy growth of the source/drain from exposed nanosheet sidewall may be unpredictable and can lead to gaps/empty space within the source/drain epi. Also, source/drain contact formation for nanosheet device could be challenging. The source/drain current flow path is long to access bottom most sheet unless a contact gouging is formed into the source/drain epitaxy. However, forming a contact gouging into source/drain epitaxy could increase the source/drain epitaxy resistance.

BRIEF SUMMARY

Additional aspects and/or advantages will be set forth in part in the description which follows and, in part, will be apparent from the description, or may be learned by practice of the invention.

A semiconductor device including a first nanosheet channel and a second nanosheet channel located on a substrate. A nanowire connecting the first nanosheet channel to the second nanosheet channel and a source/drain epitaxy located on the nanowire.

The semiconductor device including a source/drain epitaxy located under a contact, wherein the source/drain epitaxy has a cross-bar shape.

A method including forming a plurality of nanosheets on a substrate and forming a plurality of sacrificial layers on the substrate, wherein the plurality of nanosheets and the plurality of sacrificial layers are arranged as alternating layers. Forming and patterning a first hardmask located on top of one of the sacrificial layers and forming a second hardmask around the first hardmask. Patterning the plurality of nanosheets and the plurality of sacrificial layers. Forming and patterning a dummy gate located on top of first hard mask. Removing the plurality of sacrificial layers. Forming a plurality of nanowires, where the plurality of nanowires is formed by the removal of the plurality of sacrificial layers, where the removal of the plurality of sacrificial layers thins sections of each of the plurality of nanowires forming the plurality of nanowires.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
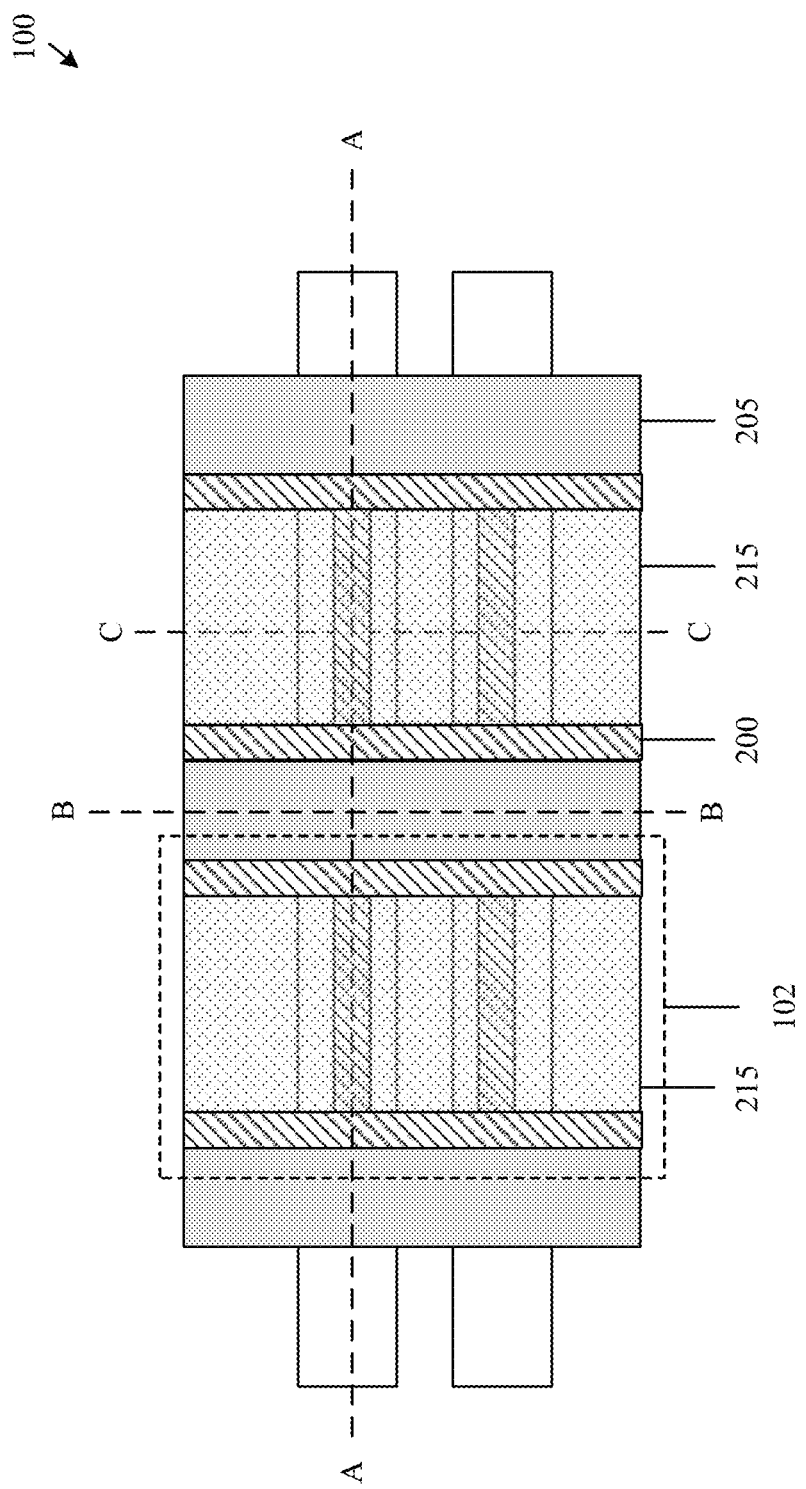
FIG. 1 illustrates a top-down view of a nano device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. During the manufacturing of nanosheet devices a source/drain epitaxy needs to be formed. The formation of the source/drain epitaxy can have issues, such as, the source/drain epitaxy can be formed with missing material at locations, i.e., holes or gaps. The source/drain epitaxy typically grows from the side of the nanosheet stack, where the growth starts on the exposed sidewalls of the nanosheets (i.e., the exposed Si sidewall) and extends outwardly. The source/drain epitaxy can grow at different rates at different locations on the nanosheets. For example, the source/drain epitaxy growth at a top portion of the nano stack could be faster than the growth at a bottom portion of the nano stack. The different growth rates can cause sections of the source/drain epitaxy to be prematurely pinched off before completing the source/drain epitaxy growth. Once top source/drain epitaxy merges (i.e., pinches off the top section) which will prevent gas flow to bottom portion. Thus, once the gas flow to the bottom portion is prevent then the source/drain epitaxy growth is halted early. In addition, the contact formation of nanosheet device can be challenging. The current flow path to bottom most sheet is long unless a deep contact gouging is formed into the source/drain epi, which could lead to high source/drain epitaxy resistance.

The present invention is directed to a structure and method for forming a void free source/drain epitaxy for a nanosheet device. The nanosheets are thin down to form nanowires in the location between where the nanosheet columns will be formed, so that the nanowires stay connected to the nanosheet it was formed from. The nano connectors or nanowire allows for the source drain epitaxy to grow along the length of the wires and extend outwardly from there. The source/drain epitaxy encapsulates each of the nano connector and forms a unique ladder pattern when view from a top-down perspective. The configuration of such source/drain epitaxy also enables greater source/drain contact area and short path for current flow to access bottom most nanosheets, which reduces the source/drain contact resistance.

FIG. 1 illustrates a top-down view of a nano device 100, in accordance with an embodiment of the present invention. FIG. 1 illustrates an exemplary nano device 100 that includes a plurality of fins, a plurality of gates that span across the fins and a source/drain epitaxy structure that spans across the fins. As dash box 102 indicates a general location of the source/drain epitaxy, such that the source/drain epitaxy has a ladder like shape/pattern when viewed from a top-down perspective. The ladder/cross-bar like shape of source/drain epitaxy has two parallel elements (i.e., the rails) that extend along one axis and two parallel elements (i.e., the rungs) that extend across a second axis. Where the first axis is perpendicular to the second axis. A contact 215 is formed between the source/drain epitaxy 200 (i.e., the rails) that extends along the gates 205 so that the contact 215 encapsulates each of the rungs/bars of the source/drain epitaxy 200. Therefore, the contact is located on three sides of the rung/bar of the source/drain epitaxy 200. The source/drain epitaxy 200 forms a cross bar shape under the contact 215.

Figure 2:
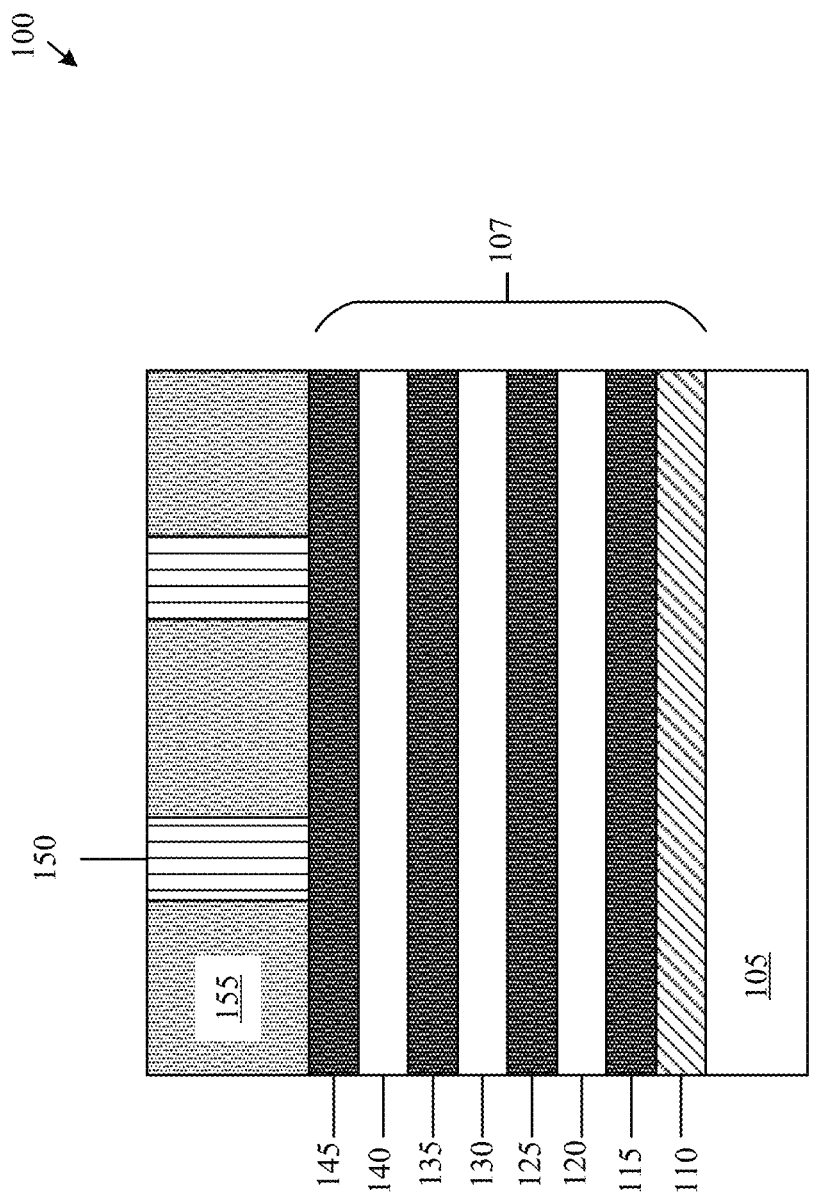
FIG. 2 illustrates cross section C of the nano device after formation and patterning of a first hard mask and formation of a second hard mask, in accordance with the embodiment of the present invention.

FIG. 2 illustrates cross section C of the nano device 100 after formation and pattering of a first hardmask 150 and formation of a second hardmask 155, in accordance with the embodiment of the present invention. The nano device 100 includes a substrate 105 and a nano stack 107 formed on top of the substrate 105. The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprised of an amorphous, polycrystalline, or monocrystalline. The semiconductor substrate 105 may be doped, undoped or contain doped regions and undoped regions therein.

The nano stack 107 includes a first layer 110, a second layer 115, a third layer 120, a fourth layer 125, a fifth layer 130, a sixth layer 135, a seven layer 140, and an eighth layer 145. The first layer 110 can be comprised of, for example, SiGe, where Ge is in the range of about 45% to 70%. The nanosheet stack 107 includes a group of sacrificial layers comprised of the second layer 115, the fourth layer 125, the sixth layer 135, the eighth layer 145. Each of the sacrificial layers can be comprised of, for example, SiGe, where Ge is in the range of about 15% to 35%. The nanosheet stack 107 includes a group of nanosheets comprised of the third layer 120, the fifth layer 130, the seventh layer 140. Each layer of the group of nano sheets can be comprised of, for example, Si. The group of sacrificial layers and the group of nanosheets are arranged as alternating layers.

A first hardmask 150 is formed on top of the eighth layer 145. The first hardmask 150 can be comprised of a first material, for example, SiC or SiOC. The first hardmask 150 is patterned to form the desired structure. A second hardmask 155 is formed on top of the eighth layer 145 and around the first hardmask 150, e.g., by a deposition process followed by chemical mechanical planarization (CMP). The second hardmask 155 can be comprised of a second material, for example, SiN. The first hardmask 150 includes a first material and the second hardmask 155 includes a second material, where the first material and the second material are different materials.

Figure 3:
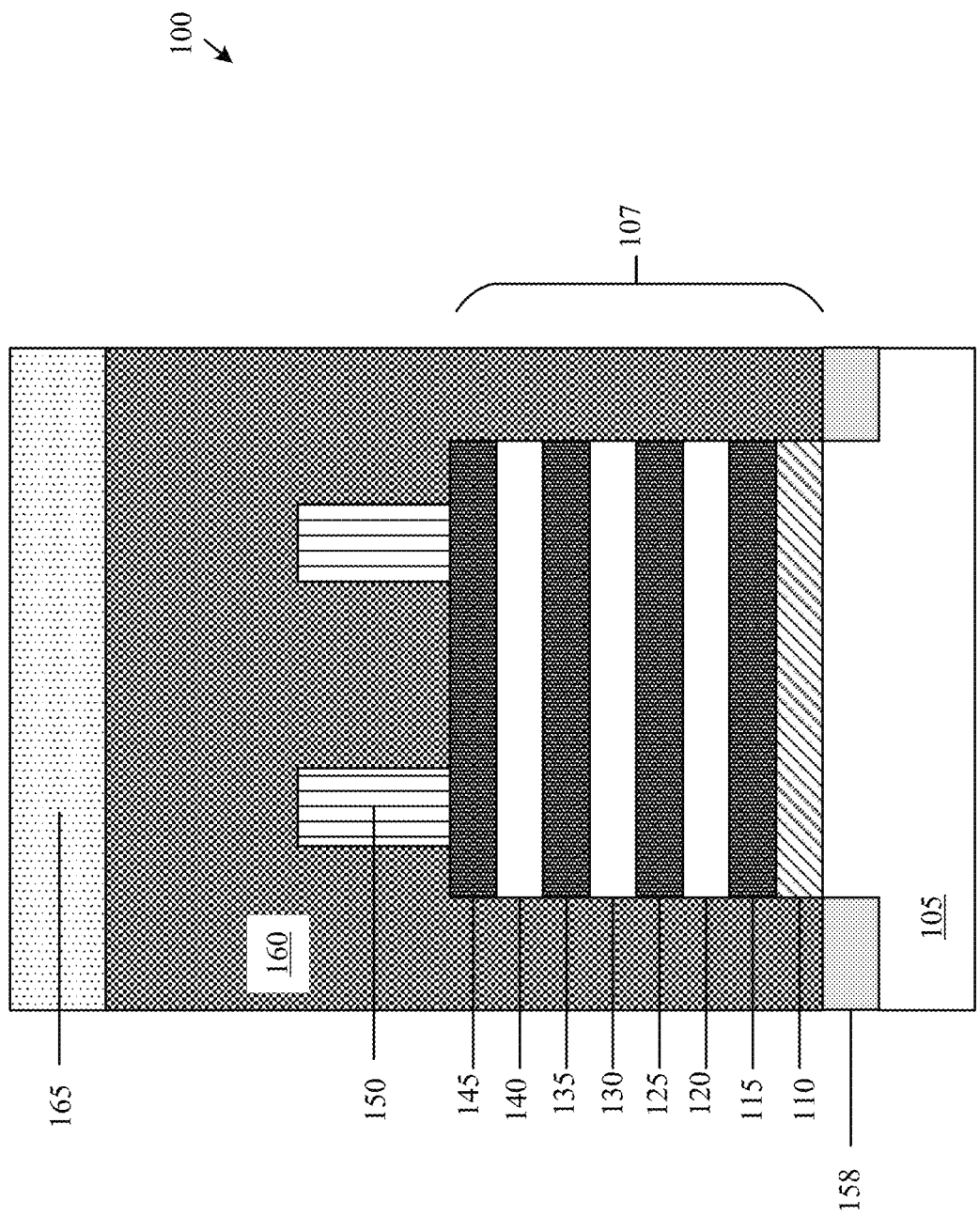
FIG. 3 illustrates cross section B of the nano device after etching the nano stack and the formation of the dummy gate, in accordance with the embodiment of the present invention.
Figure 4:
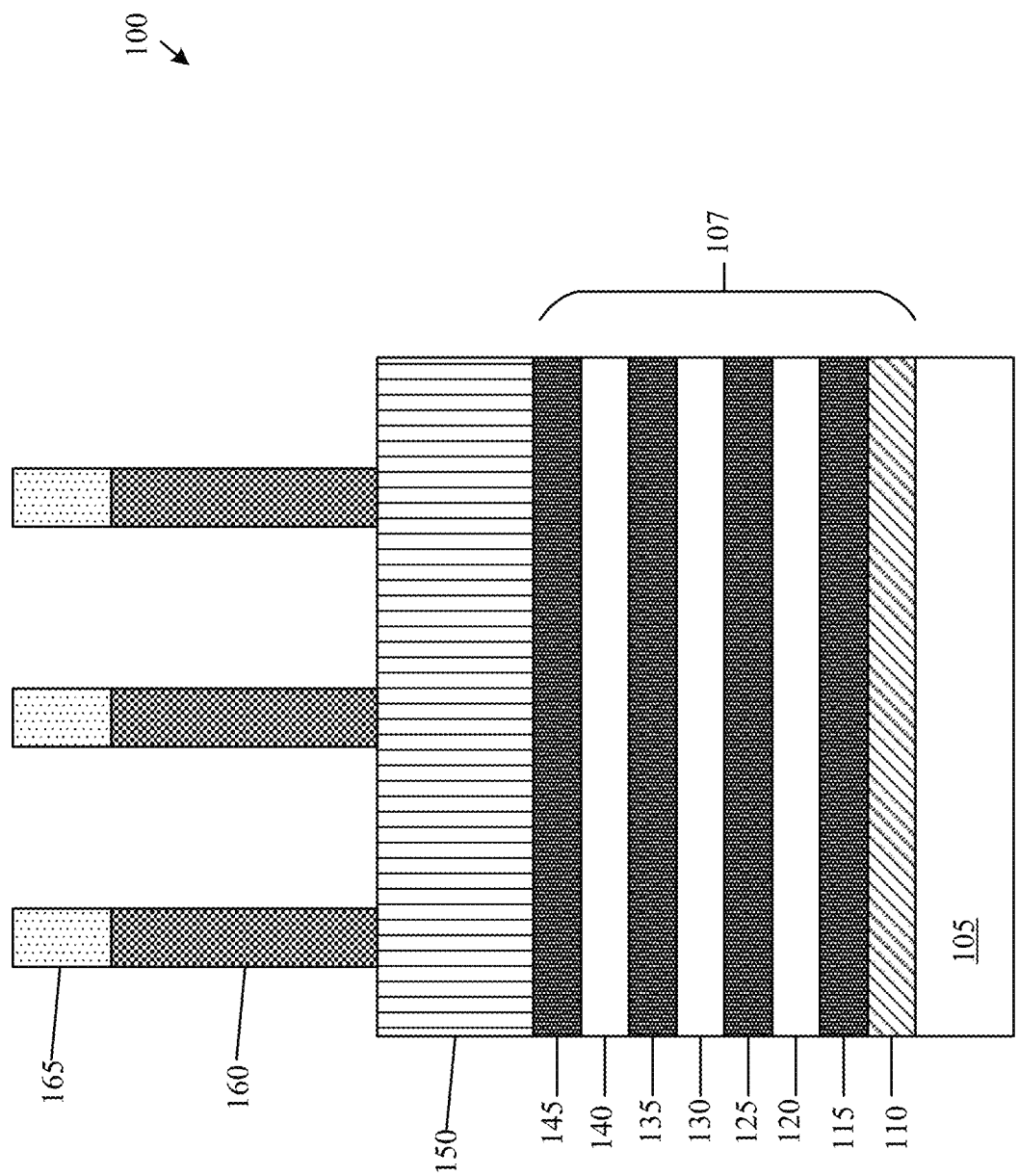
FIG. 4 illustrates cross section A of the nano device after the formation and patterning of the dummy gate, in accordance with the embodiment of the present invention.
Figure 5:
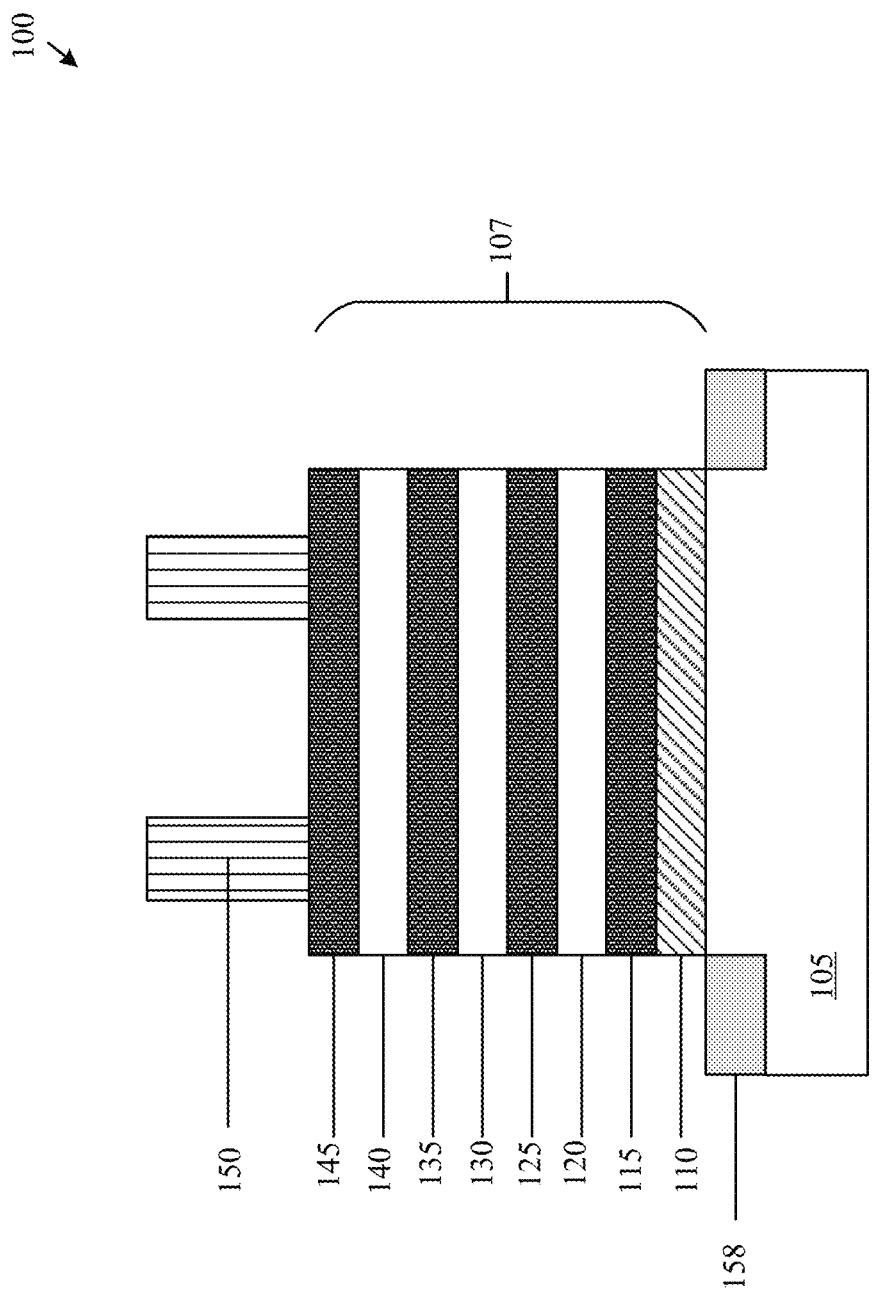
FIG. 5 illustrates cross section C of the nano device after the formation and patterning of the dummy gate, in accordance with the embodiment of the present invention.

Referring now to FIGS. 3, 4, and 5, the nano device 100 is shown/illustrated after etching the nano stack 107 and the formation of the dummy gate 160, in accordance with the embodiment of the present invention. FIG. 3 illustrates cross section B of the nano device 100, FIG. 4 illustrates cross section A of the nano device 100, FIG. 5 illustrates cross section C of the nano device 100. The second hardmask 155 is patterned and the underlying nano stack 107 is etched. A shallow trench isolation layer 158 is formed, after that, the second hardmask 155 is selectively removed. The substrate 105 is etched during the etching process of the nano stack 107, such that trenches are formed in the substrate 105. The shallow trench isolation layer 158 deposited within the trench in the substrate 105 by a dielectric overfill followed by dielectric CMP and recess. The second hardmask 155 is then selectively removed with respect to first hardmask 150. A dummy gate 160 is formed on top of the shallow trench isolation layer 158, on top of the eighth layer 145, and on top of the first hardmask 150 so that the dummy gate 160 is formed around the nano stack 107 as illustrated by FIG. 3. A third hardmask 165 is formed on top of the dummy gate 160. As illustrated by FIG. 4, the third hardmask 165 is patterned using conventional litho and etch process and the pattern is then transferred to the dummy gate 160 to form at least one column. FIG. 5 illustrates part of the nano device 100 where the dummy gate 160 that was not covered by gate hardmask 165 was removed during patterning process.

Figure 6:
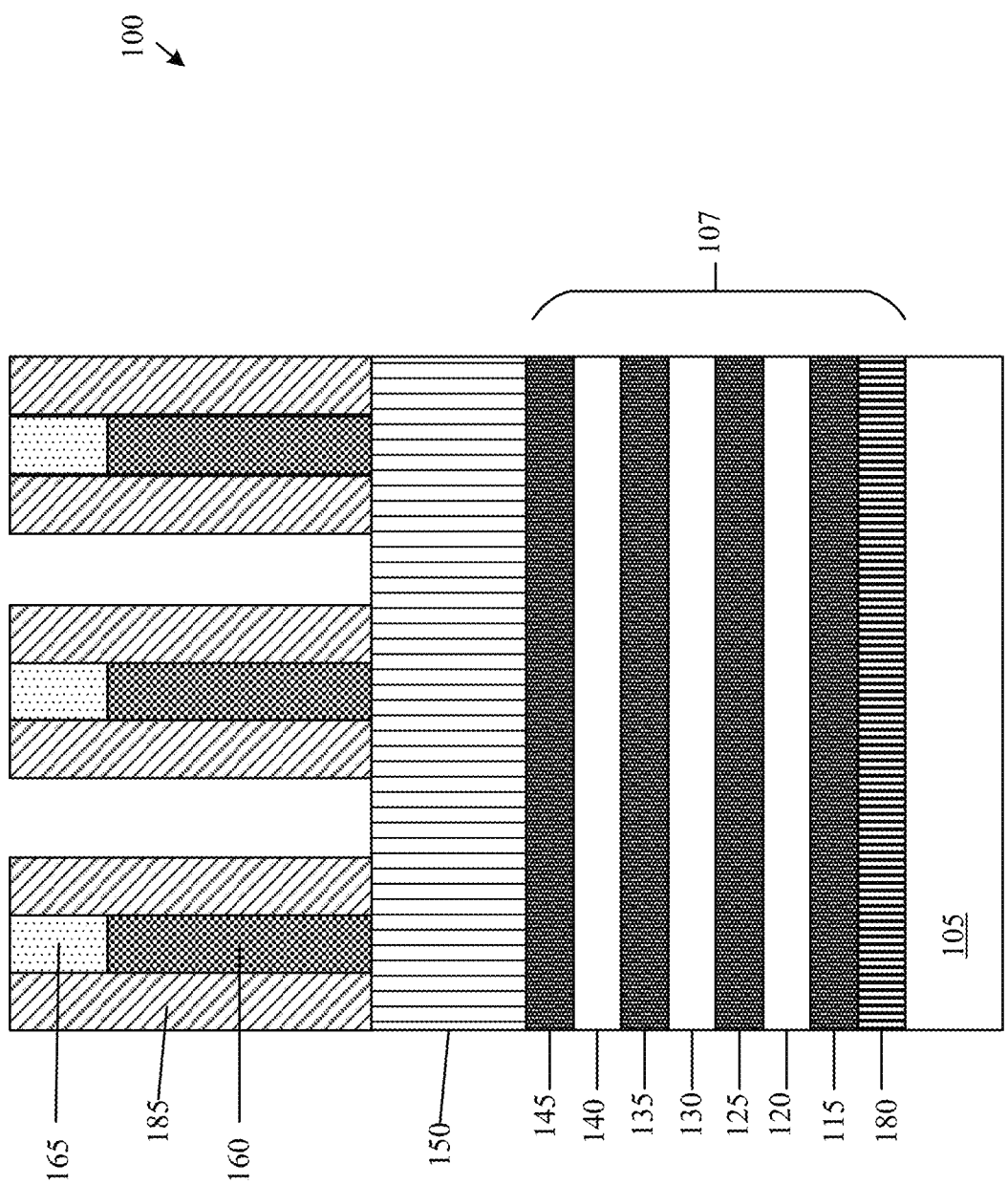
FIG. 6 illustrates cross section A of the nano device after the formation of the bottom dielectric layer and the top spacer, in accordance with the embodiment of the present invention.
Figure 7:
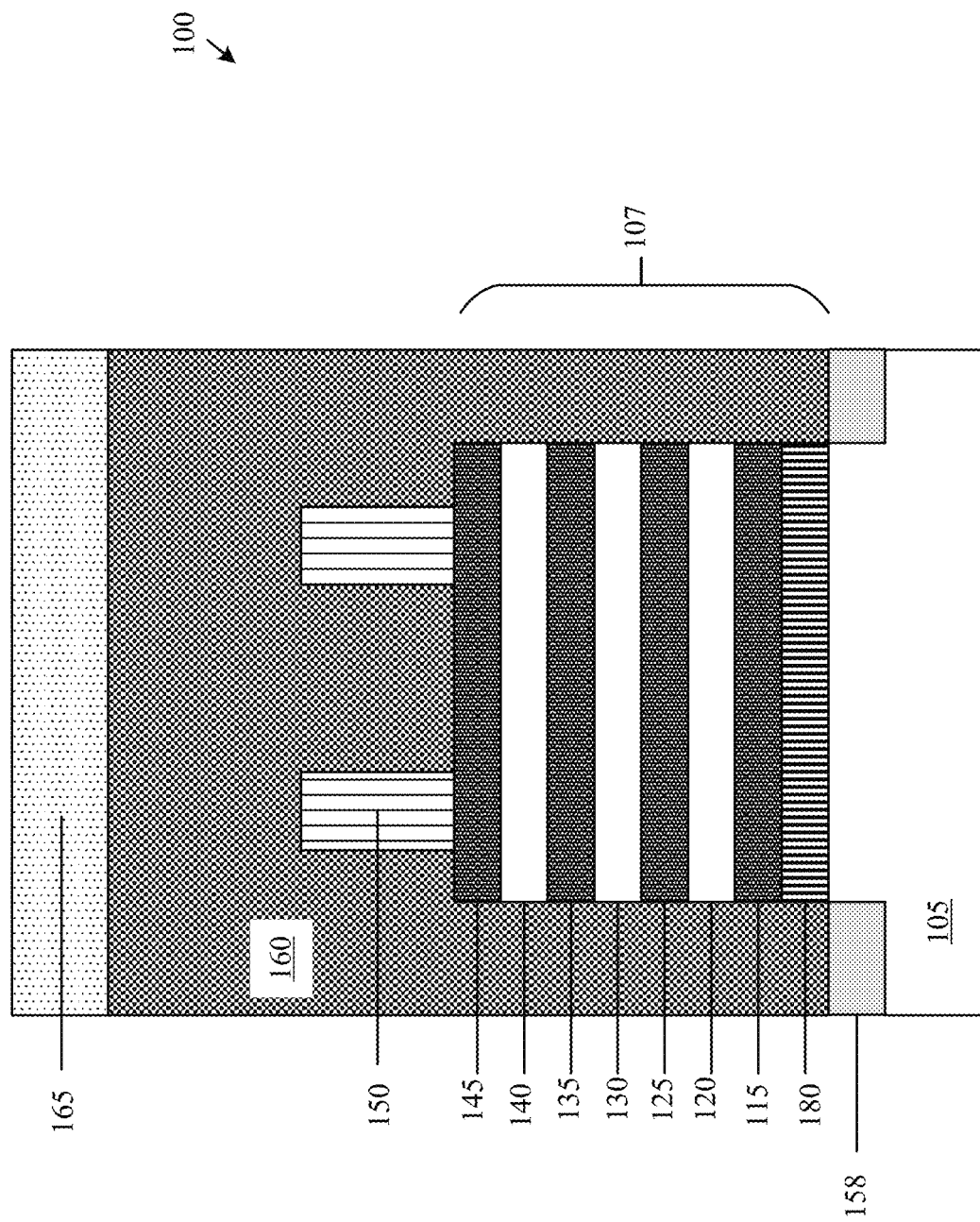
FIG. 7 illustrates cross section B of the nano device after the formation of the bottom dielectric layer and the top spacer, in accordance with the embodiment of the present invention.
Figure 8:
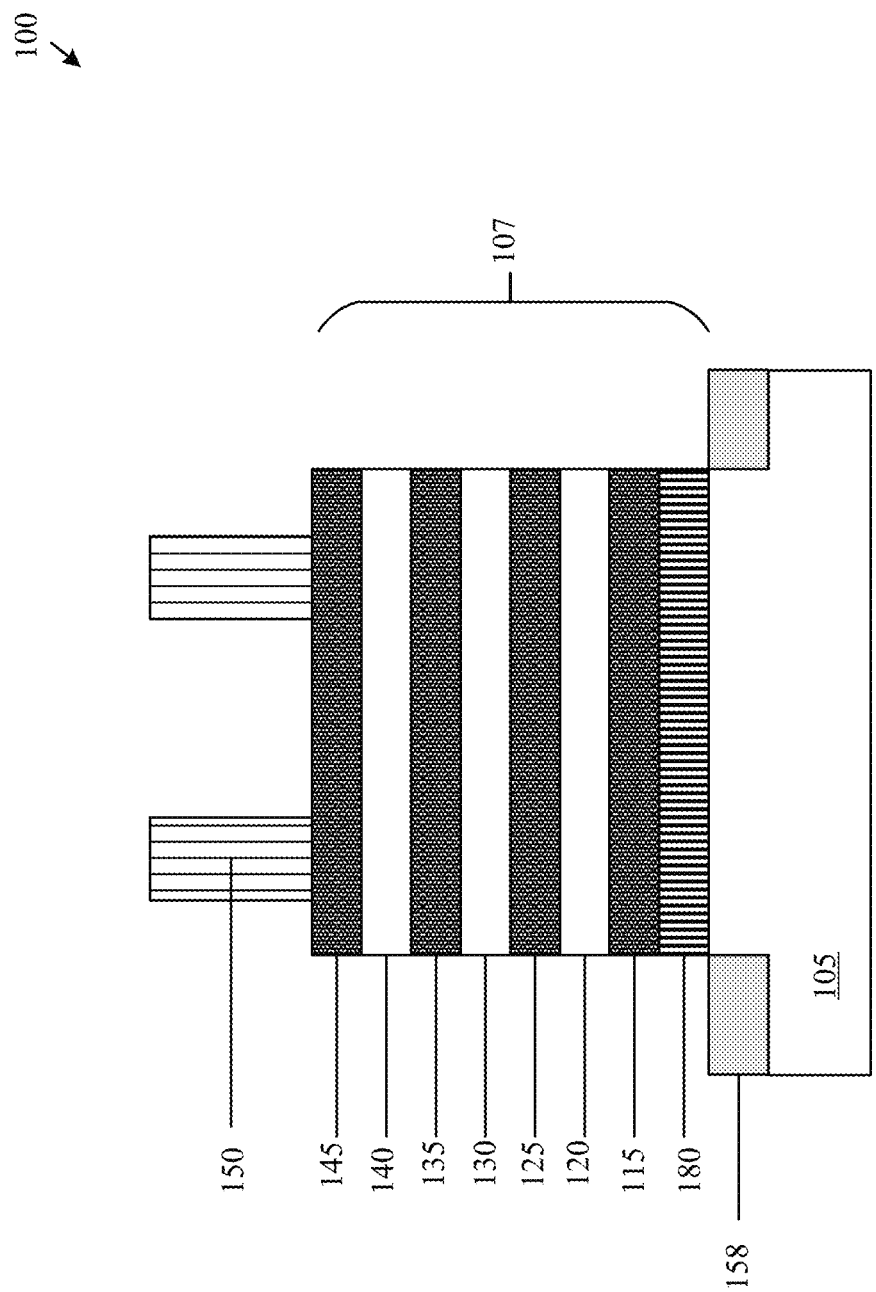
FIG. 8 illustrates cross section C of the nano device after the formation of the bottom dielectric layer and the top spacer, in accordance with the embodiment of the present invention.

Referring now to FIGS. 6, 7, and 8, the nano device 100 is shown/illustrated after the formation of the bottom dielectric layer 180 and the top spacer 185, in accordance with the embodiment of the present invention. FIG. 6 illustrates cross section A of the nano device 100, FIG. 7 illustrates cross section B of the nano device 100, FIG. 8 illustrates cross section C of the nano device 100. The first layer 115 is selectively removed and replaced with a bottom dielectric layer 180. A top spacer 185 is formed on the top of the exposed surfaces of the first hardmask 150, the dummy gate 160 and the third hardmask 165. The top spacer 185 is etched back so that only a portion of the top spacer 185 remains located adjacent to each of the columns/pillar comprised of the dummy gate 160 and the third hardmask 165.

Figure 9:
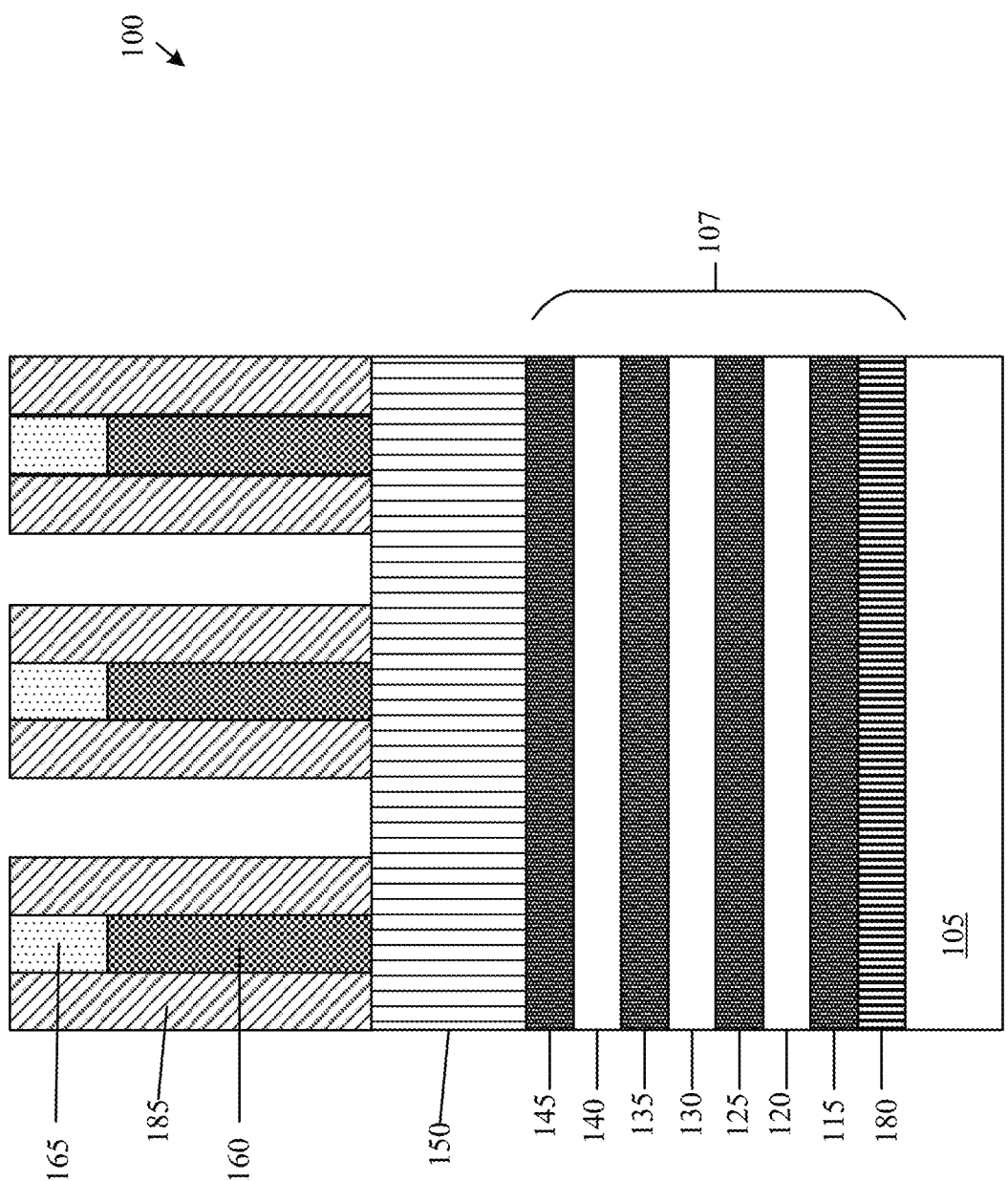
FIG. 9 illustrates cross section A of the nano device after the recessing the nano stack in the region where the source/drain will be formed, in accordance with the embodiment of the present invention.
Figure 10:
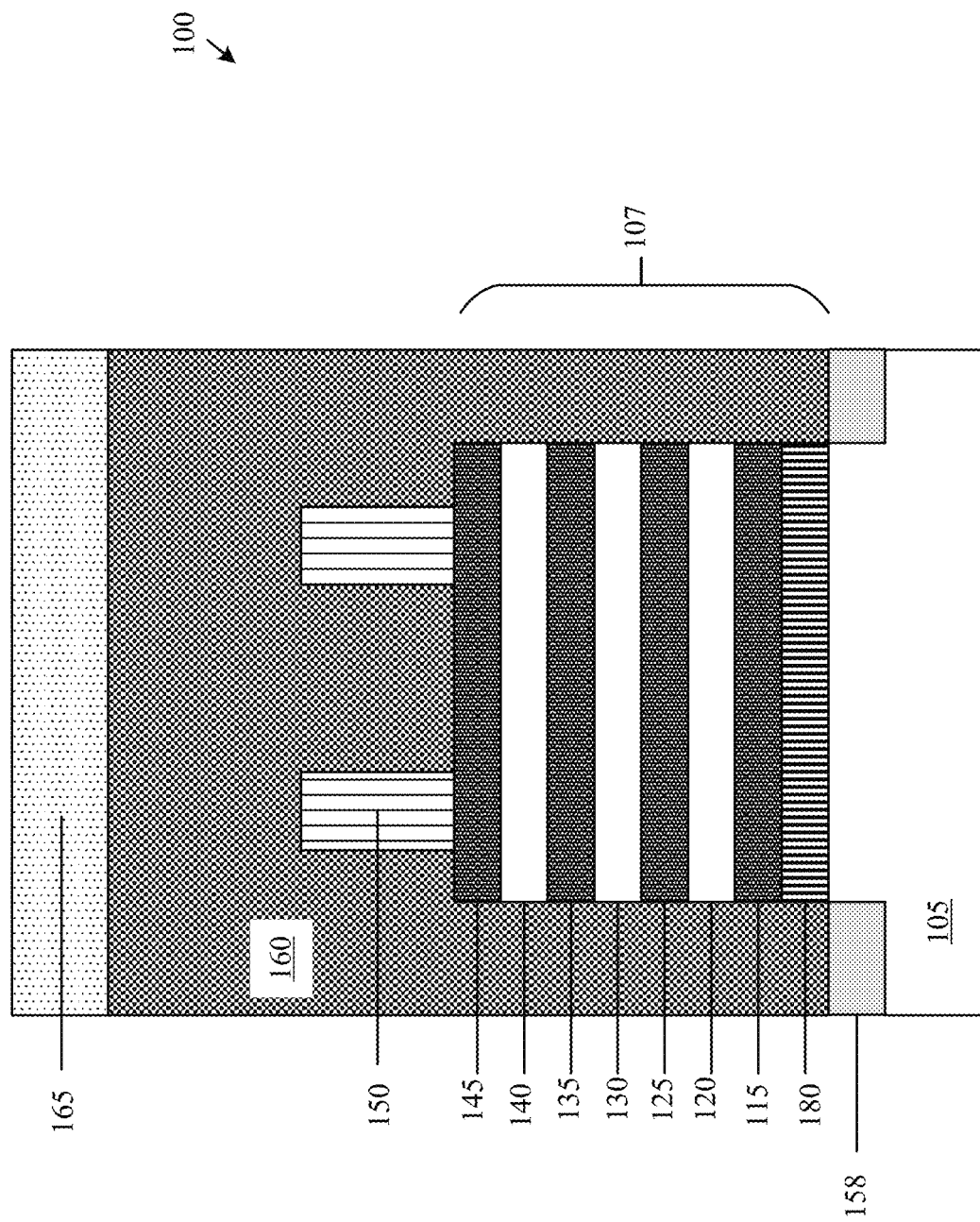
FIG. 10 illustrates cross section B of the nano device after the recessing the nano stack in the region where the source/drain will be formed, in accordance with the embodiment of the present invention.
Figure 11:
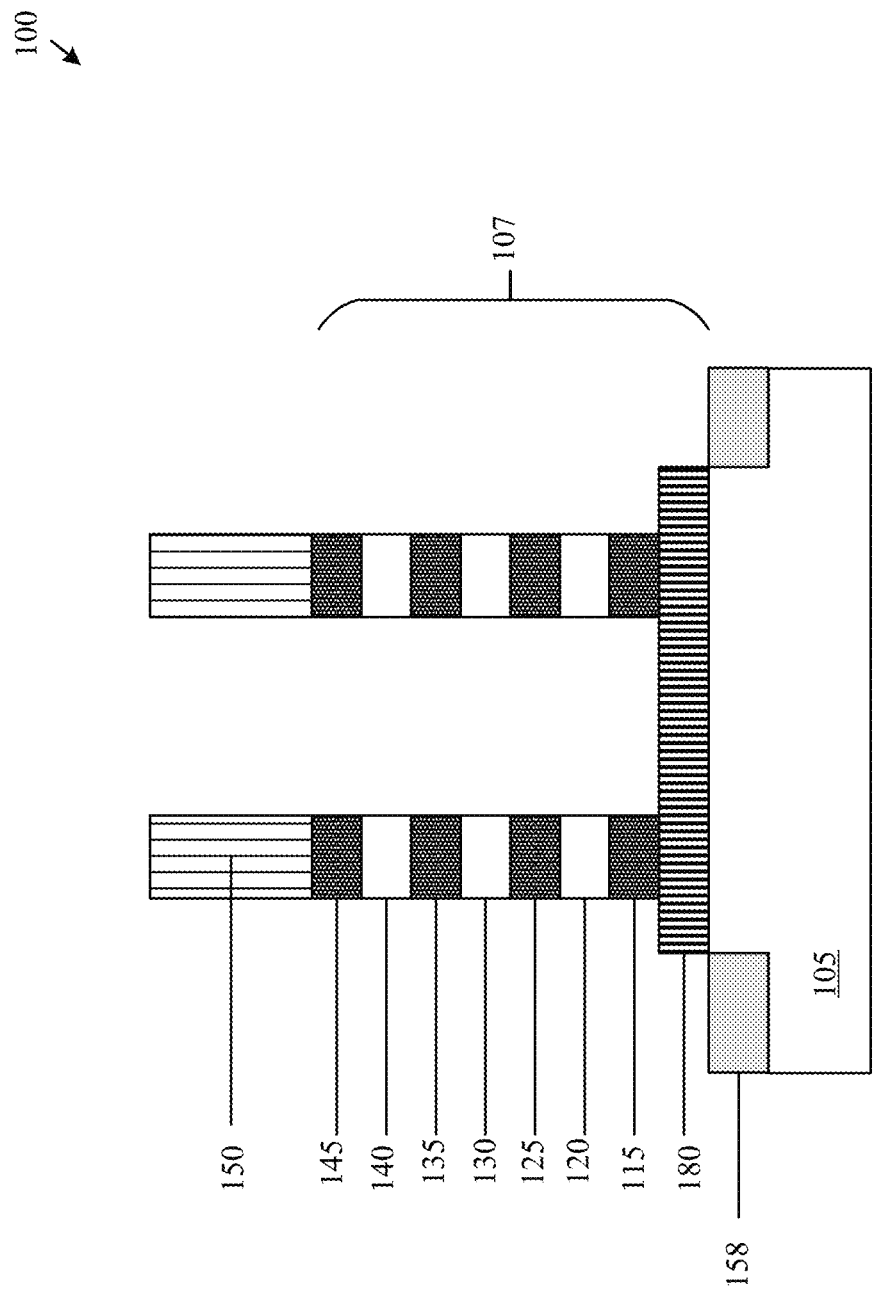
FIG. 11 illustrates cross section C of the nano device emphasizing the source/drain region after the recessing the nano stack, in accordance with the embodiment of the present invention.

Referring now to FIGS. 9, 10, and 11, the nano device 100 is shown/illustrated after the recessing the nano stack 107 in the region where the source/drain will be formed, in accordance with the embodiment of the present invention. FIG. 9 illustrates cross section A of the nano device 100, FIG. 10 illustrates cross section B of the nano device 100, FIG. 11 illustrates cross section C of the nano device 100. The nano stack 107 is etched in the source/drain region, where the first hardmask 150 determines the part of the nano stack 107 that will remain. The third layer 120, the fifth layer 130, and the seventh layer 140 will become the nanowires in this region that will connect the nanosheets through the source/drain region.

Figure 12:
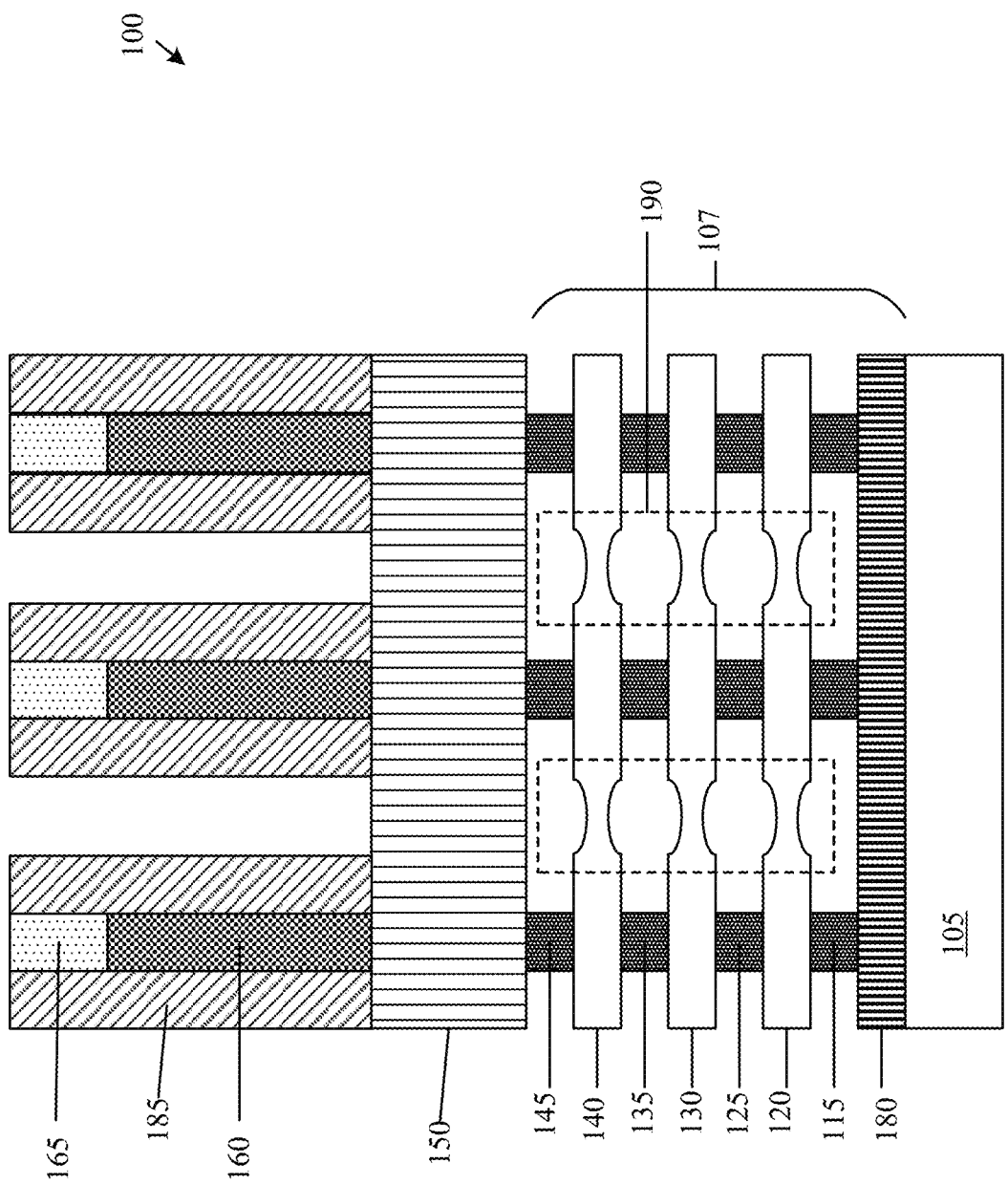
FIG. 12 illustrates cross section A of the nano device after recessing the sacrificial layers and thinning of nanosheets, in accordance with the embodiment of the present invention.
Figure 13:
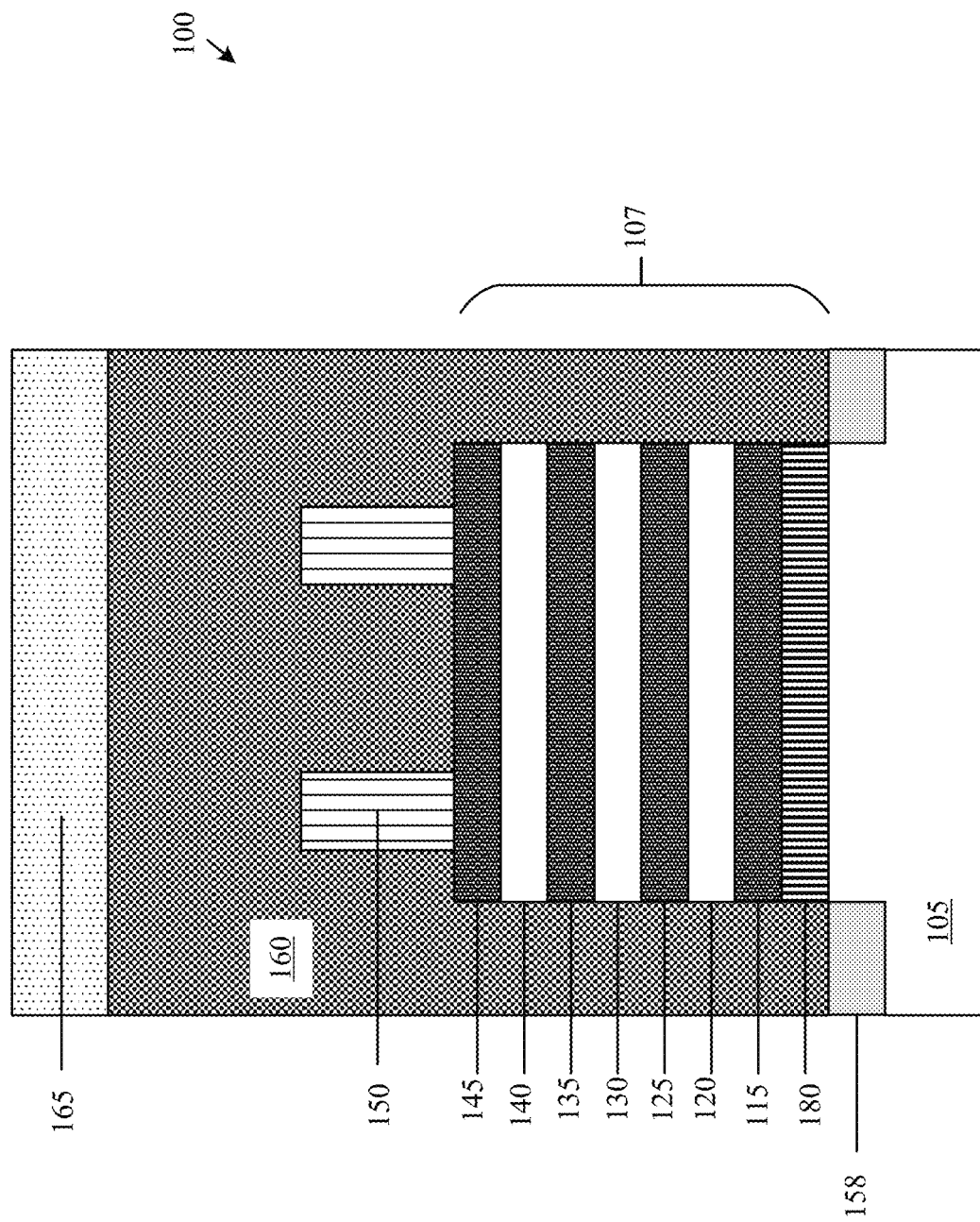
FIG. 13 illustrates cross section B of the nano device after recessing the sacrificial layers and thinning of nanosheets, in accordance with the embodiment of the present invention.
Figure 14:
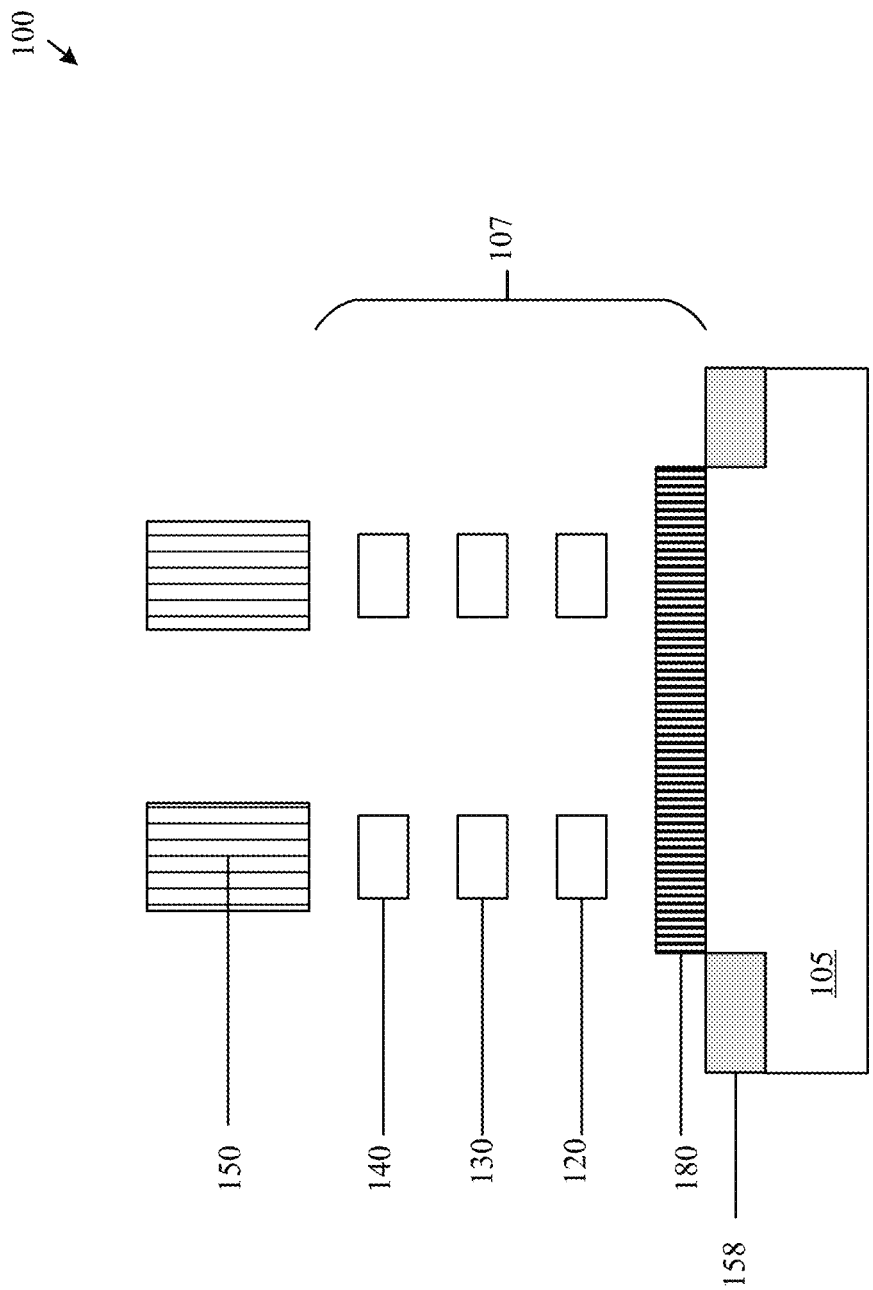
FIG. 14 illustrates cross section C of the nano device after recessing the sacrificial layers and thinning of nanosheets, in accordance with the embodiment of the present invention.

Referring now to FIGS. 12, 13, and 14, the nano device 100 is shown/illustrated after recessing the sacrificial layers and thinning of nanosheets, in accordance with the embodiment of the present invention. FIG. 12 illustrates cross section A of the nano device 100, FIG. 13 illustrates cross section B of the nano device 100, FIG. 14 illustrates cross section C of the nano device 100. The sacrificial layers that include the second layer 115, the fourth layer 125, the sixth layer 135, and the eighth layer 145 are recessed using an etching process that targets the material (e.g., SiGe) of the sacrificial layers. The etching process that is used to recess the sacrificial layers also removes material (e.g., Si) from the nanosheets (e.g., the third layer 120, the fifth layer 130, and the seventh layer 140), but at a much slower rate. The removal of material from the nanosheets (e.g., the third layer 120, the fifth layer 130, and the seventh layer 140) causes the thinning of the nanosheets. The nanosheets are thinned at locations that have the longest exposure time to the etching process. The dashed boxes 190 emphasize the locations where the nanosheets are thinned. The nanosheets are not severed or cut in these locations but are only thinned such that a nanowire is formed out of each nanosheet at each of these locations. The nanosheet still remains as a continuous sheet as the sheet transitions through thinned sections and non-thinned sections. The nanosheet (e.g., the third layer 120, or the three nanosheets that are included in the third layer 120 as illustrated in FIG. 12) is in the same horizontal plane as the nanowire (the two thin sections emphasized in dashed box 190).

Figure 15:
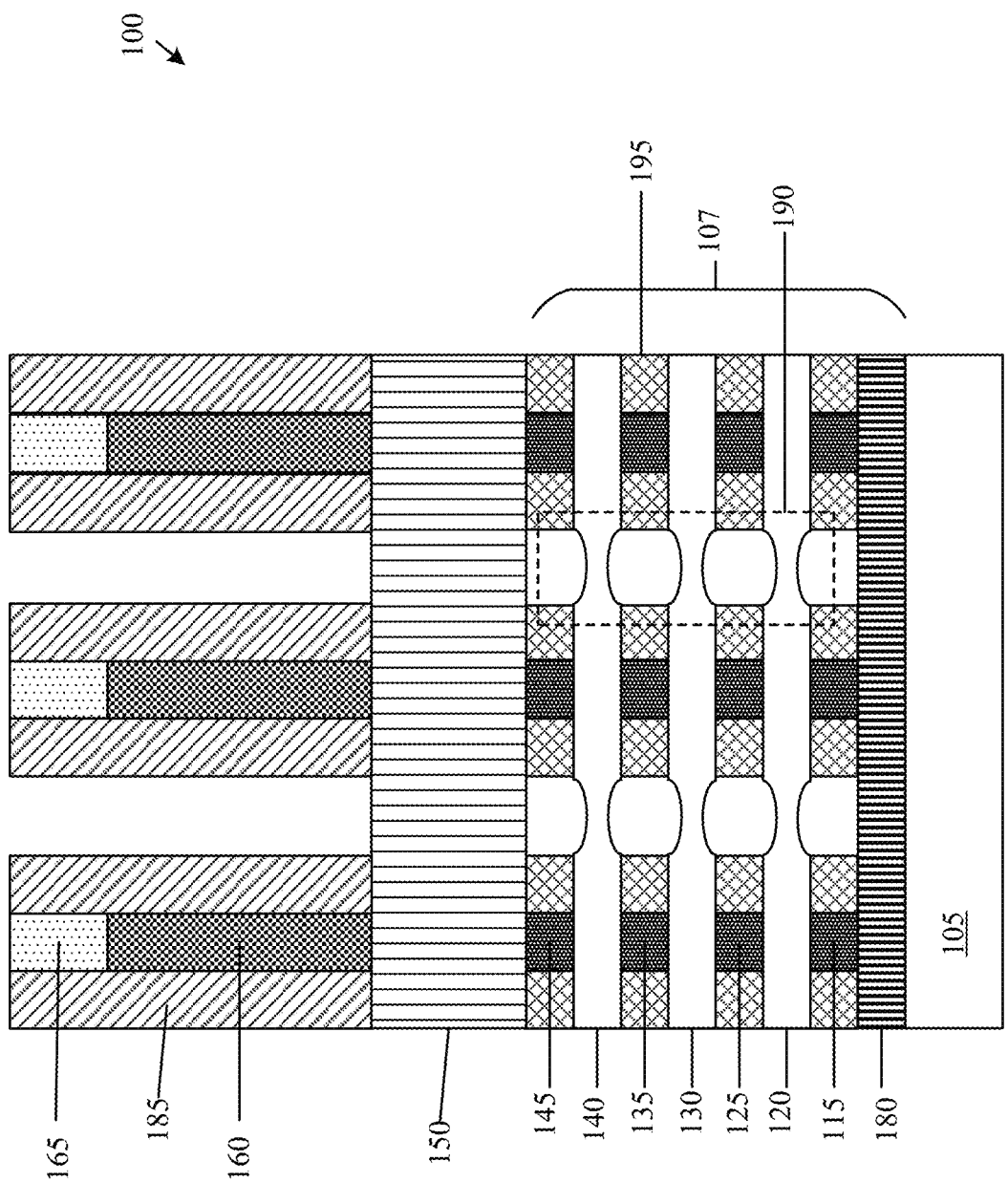
FIG. 15 illustrates cross section A of the nano device after the formation of the inner spacer, in accordance with the embodiment of the present invention.
Figure 16:
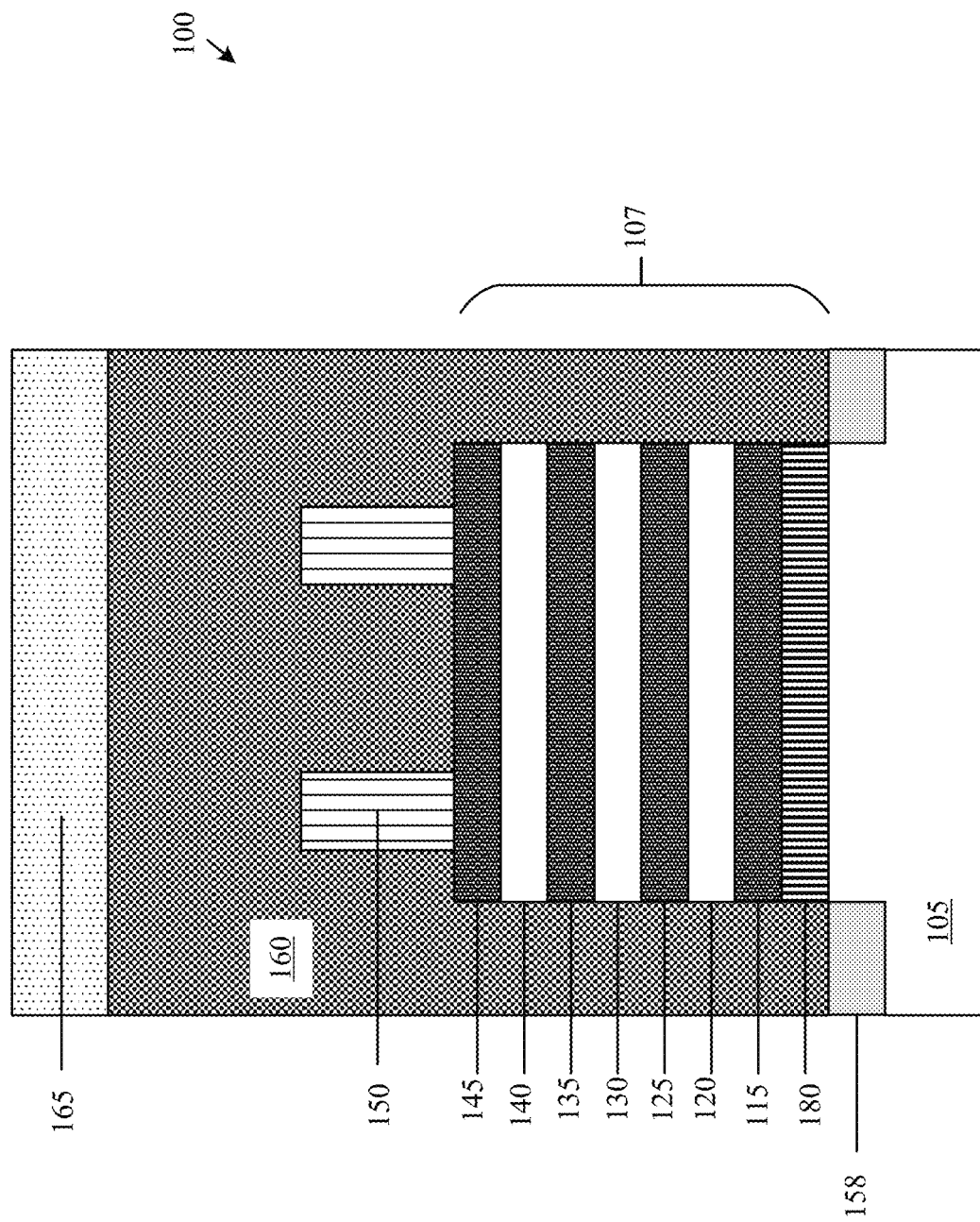
FIG. 16 illustrates cross section B of the nano device after the formation of the inner spacer, in accordance with the embodiment of the present invention.
Figure 17:
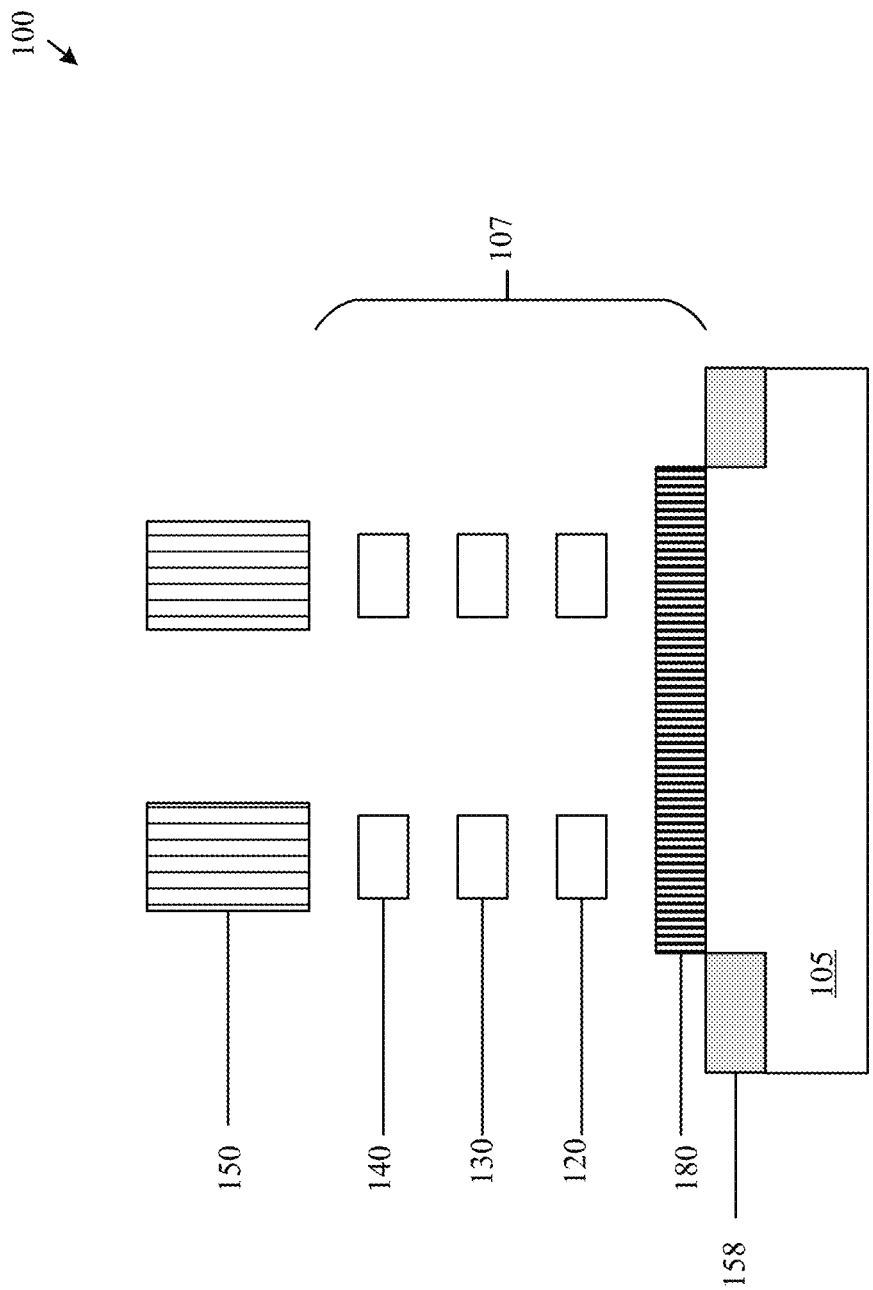
FIG. 17 illustrates cross section C of the nano device after the formation of the inner spacer, in accordance with the embodiment of the present invention.

Referring now to FIGS. 15, 16, and 17, the nano device 100 is shown/illustrated after the formation of the inner spacer 195, in accordance with the embodiment of the present invention. FIG. 15 illustrates cross section A of the nano device 100, FIG. 16 illustrates cross section B of the nano device 100, FIG. 17 illustrates cross section C of the nano device 100. An inner spacer 195 is formed on the surfaces of the nanosheets (e.g., the third layer 120, the fifth layer 130, and the seventh layer 140) adjacent to the remaining sections of the sacrificial layers (e.g., the second layer 115, the fourth layer 125, the sixth layer 135, and the eighth layer 145). The inner spacer 195 is located beneath the sections of the top spacer 185. The thinned sections of the nanosheets (as emphasized by dashed box 190) is located between the sections of the inner spacer 195 and the thinned sections have a gap/empty space located above and below each section. The inner spacer is formed by depositing a conformal dielectric liner (such as SiN, SiBCN, SiOCN, etc) to pinch-off the smallest space (which is between the nanosheets that are not thinned under the spacer region), but not pinch-off the larger space (which is between the nanosheets that are thinned as highlighted in box 190), followed by an isotropic etch process to remove the dielectric liner in the non-pinch-off regions.

Figure 18:
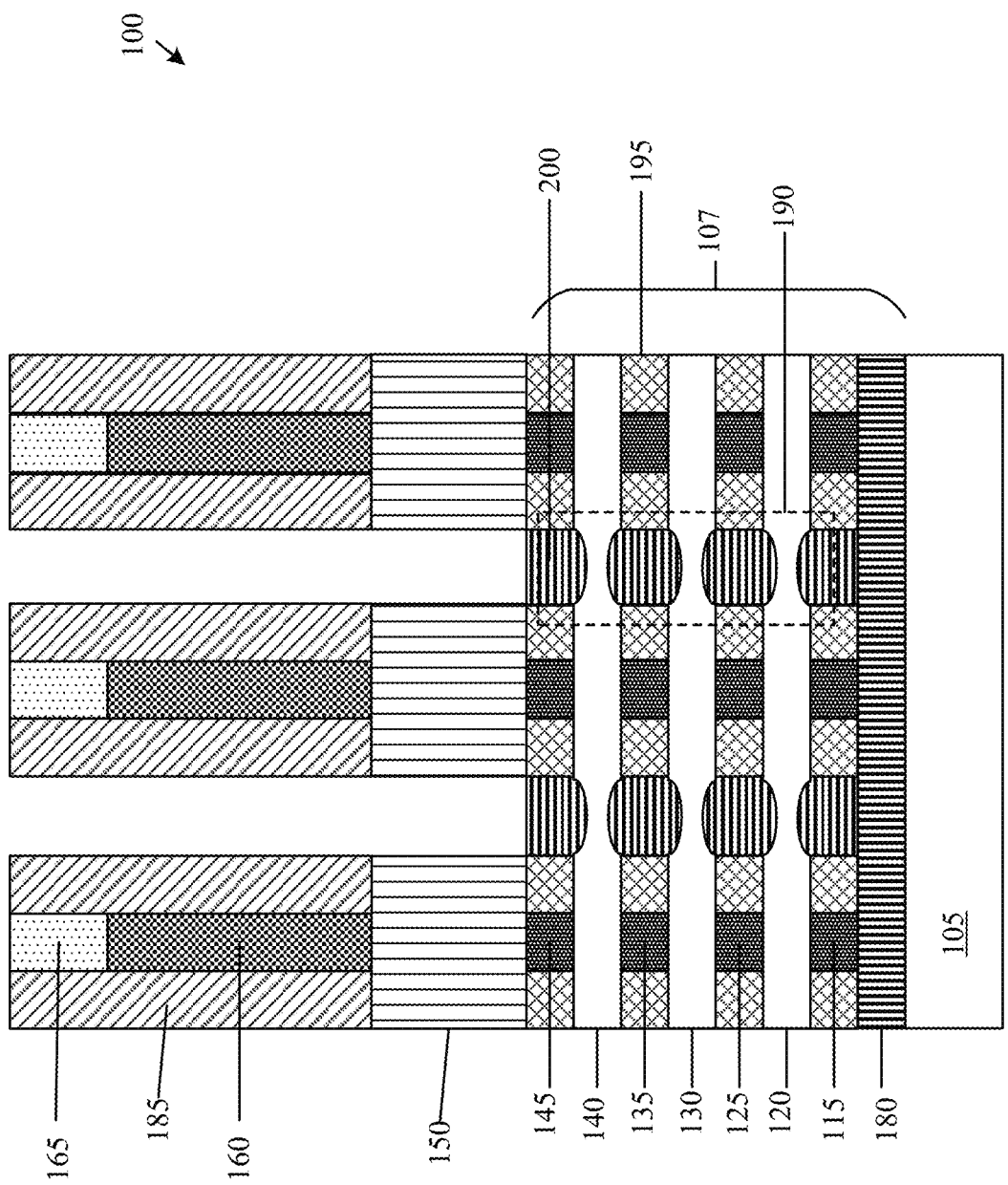
FIG. 18 illustrates cross section A of the nano device after the formation of the source/drain epi, in accordance with the embodiment of the present invention.
Figure 19:
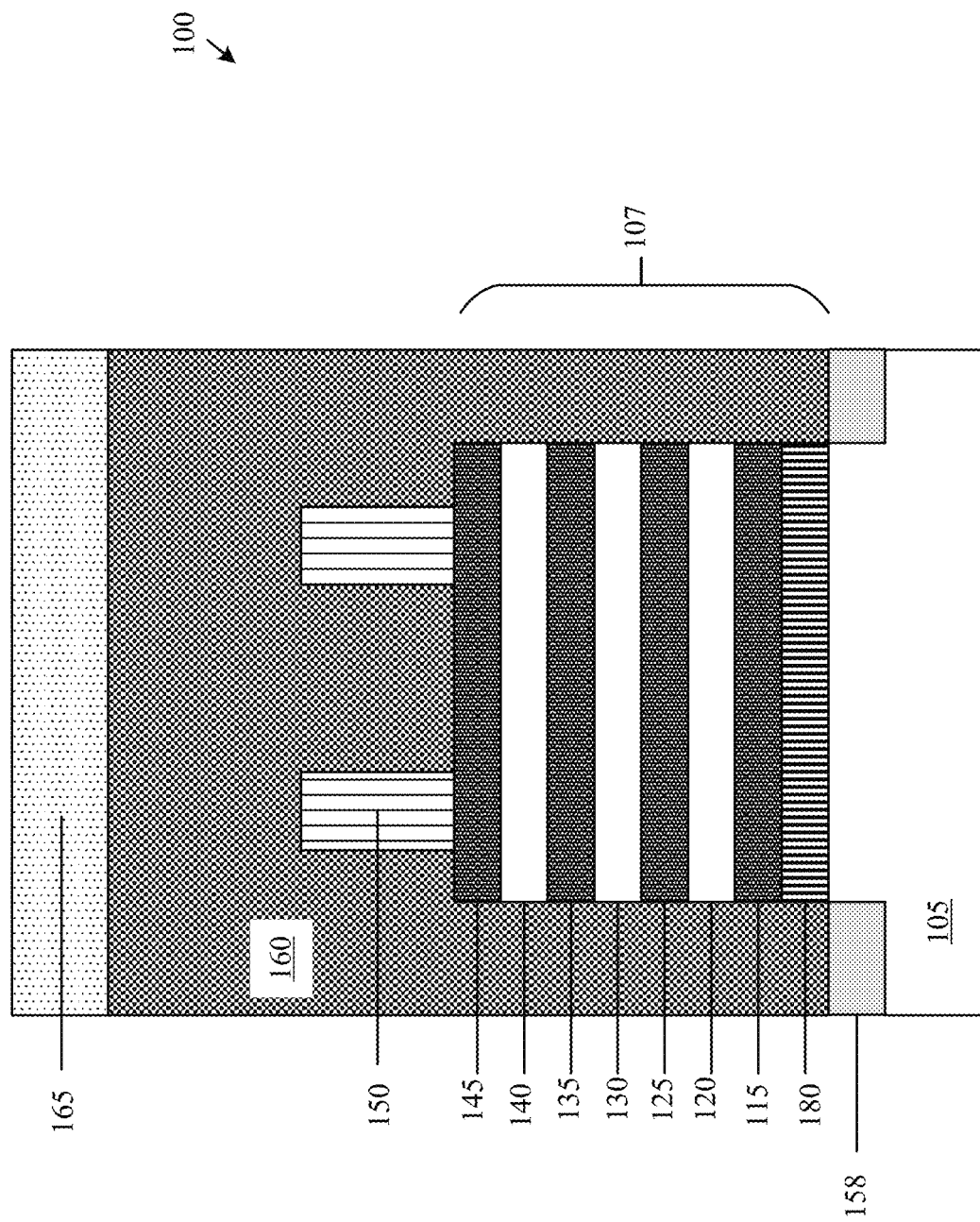
FIG. 19 illustrates cross section B of the nano device after the formation of the source/drain epi, in accordance with the embodiment of the present invention.
Figure 20:
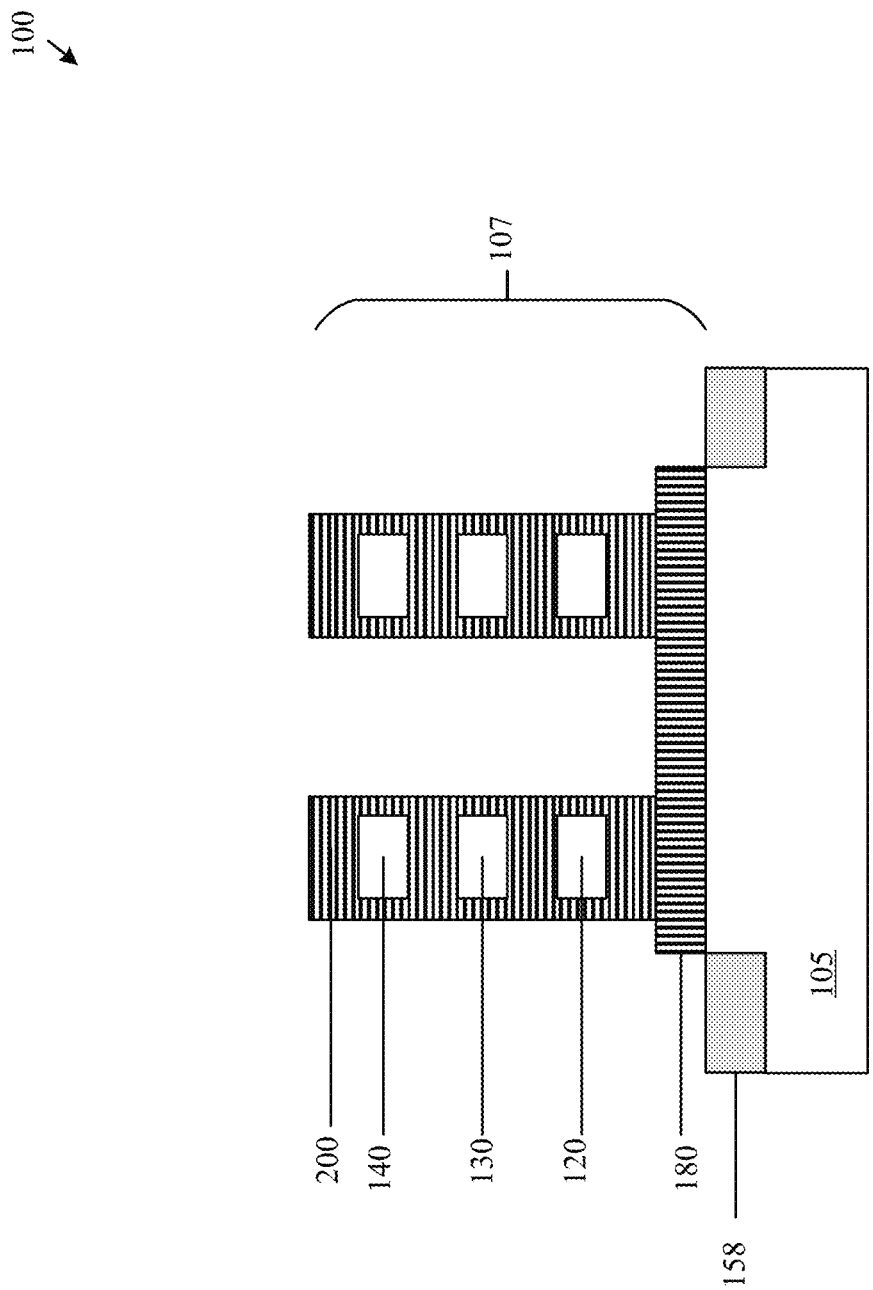
FIG. 20 illustrates cross section C of the nano device after the formation of the source/drain epi, in accordance with the embodiment of the present invention.

Referring now to FIGS. 18, 19, and 20, the nano device 100 is shown/illustrated after the formation of the source/drain epitaxy 200, in accordance with the embodiment of the present invention. FIG. 18 illustrates cross section A of the nano device 100, FIG. 19 illustrates cross section B of the nano device 100, FIG. 20 illustrates cross section C of the nano device 100. The first hardmask 150 is etched between each of the pillars as illustrated by FIG. 18. The source/drain epitaxy 200 is formed initially on the exposed surface of the nano connector/nanowires that are emphasized in dashed box 190. The source/drain epitaxy 200 can be for example, a n-type epi, or a p-type epi. For n-type epi, an n-type dopant selected from a group of phosphorus (P), arsenic (As) and/or antimony (Sb) can be used. For p-type epi, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated and diffused into junction region by thermal annealing such as laser annealing, flash annealing, rapid thermal annealing (RTA) or any suitable combination of those techniques. The source/drain epitaxy 200 is grown on the exposed surfaces of the nano connector/wires such that the source/drain epitaxy 200 encapsulates the nano connector/wires as illustrated by FIG. 20. The areas of the source/drain epitaxy 200 that was grown around the nano connectors/wires form the rungs of the ladder that are illustrated in FIG. 1. By having the source/drain epitaxy 200 grown on the thinned sections of the nanosheets, allows for the source/drain epitaxy 200 to have a larger surface area for growth when compared to growing the source/drain epitaxy 200 from the cut ends of the nanosheets. Since the source/drain epitaxy 200 is grown on a larger surface area, the growth rate is more uniform and prevents the formation of gaps/holes.

Figure 21:
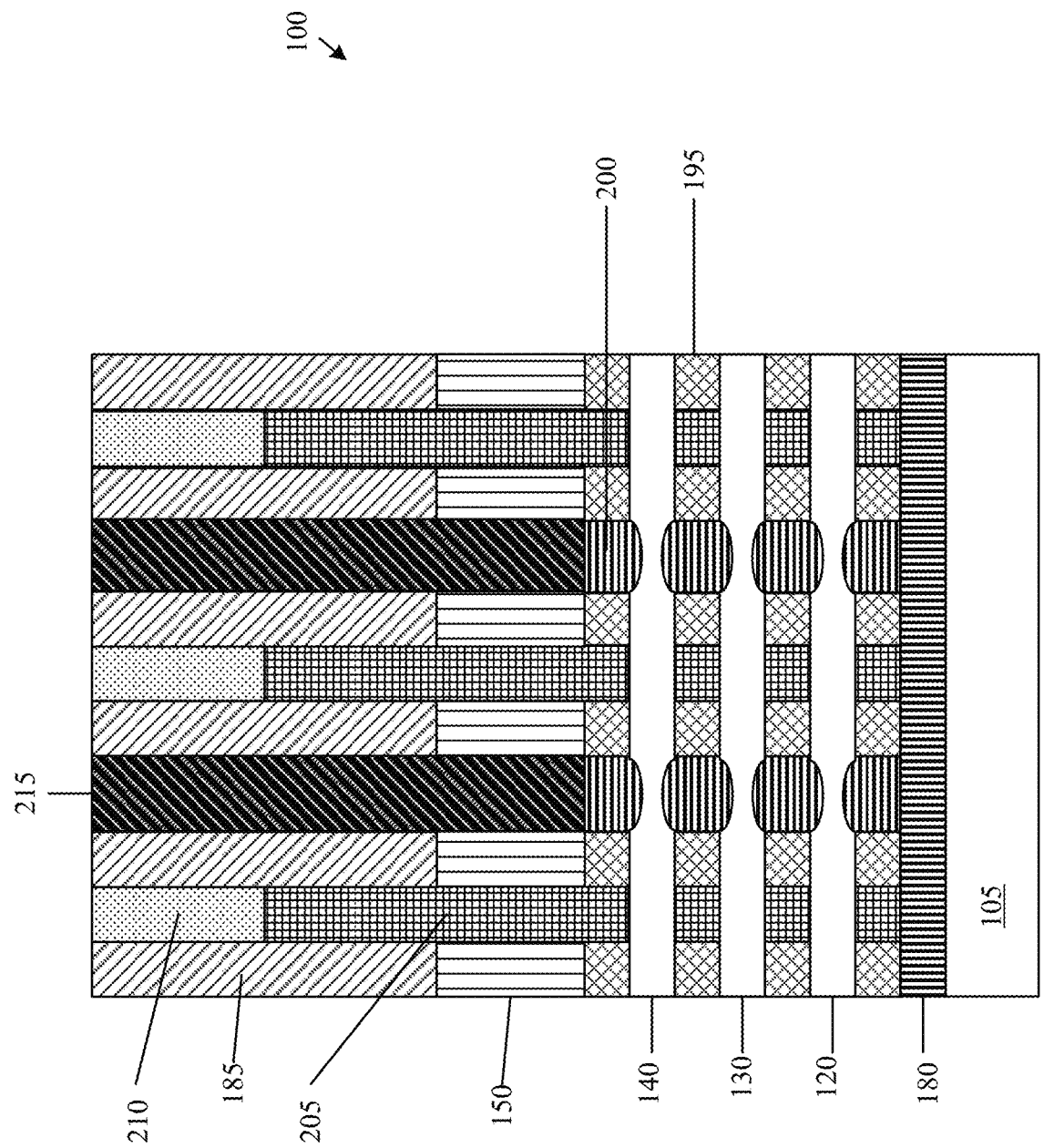
FIG. 21 illustrates cross section A of the nano device after the formation of gate, the gate cap, and the contact, in accordance with the embodiment of the present invention.
Figure 22:
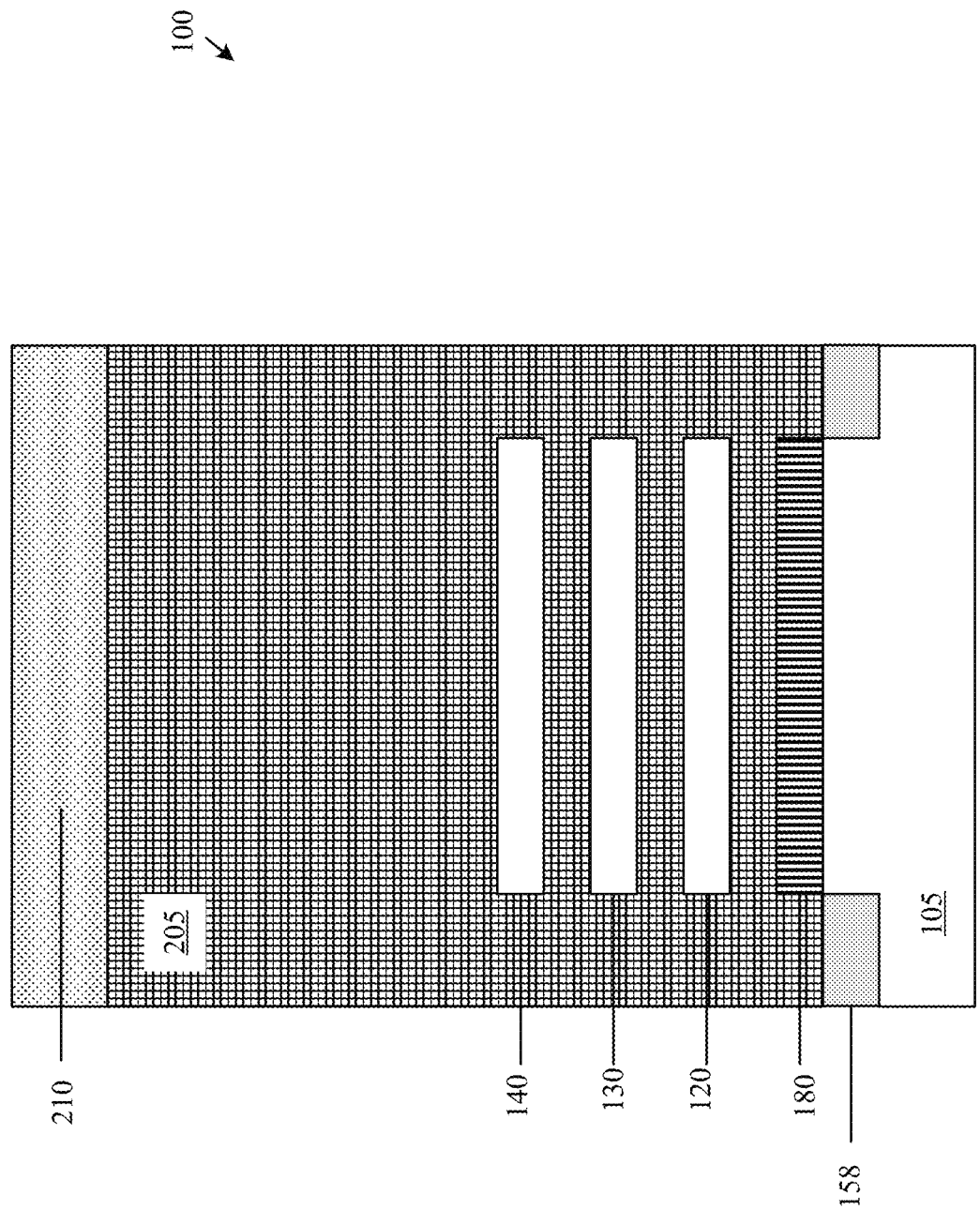
FIG. 22 illustrates cross section B of the nano device after the formation of gate, the gate cap, and the contact, in accordance with the embodiment of the present invention.
Figure 23:
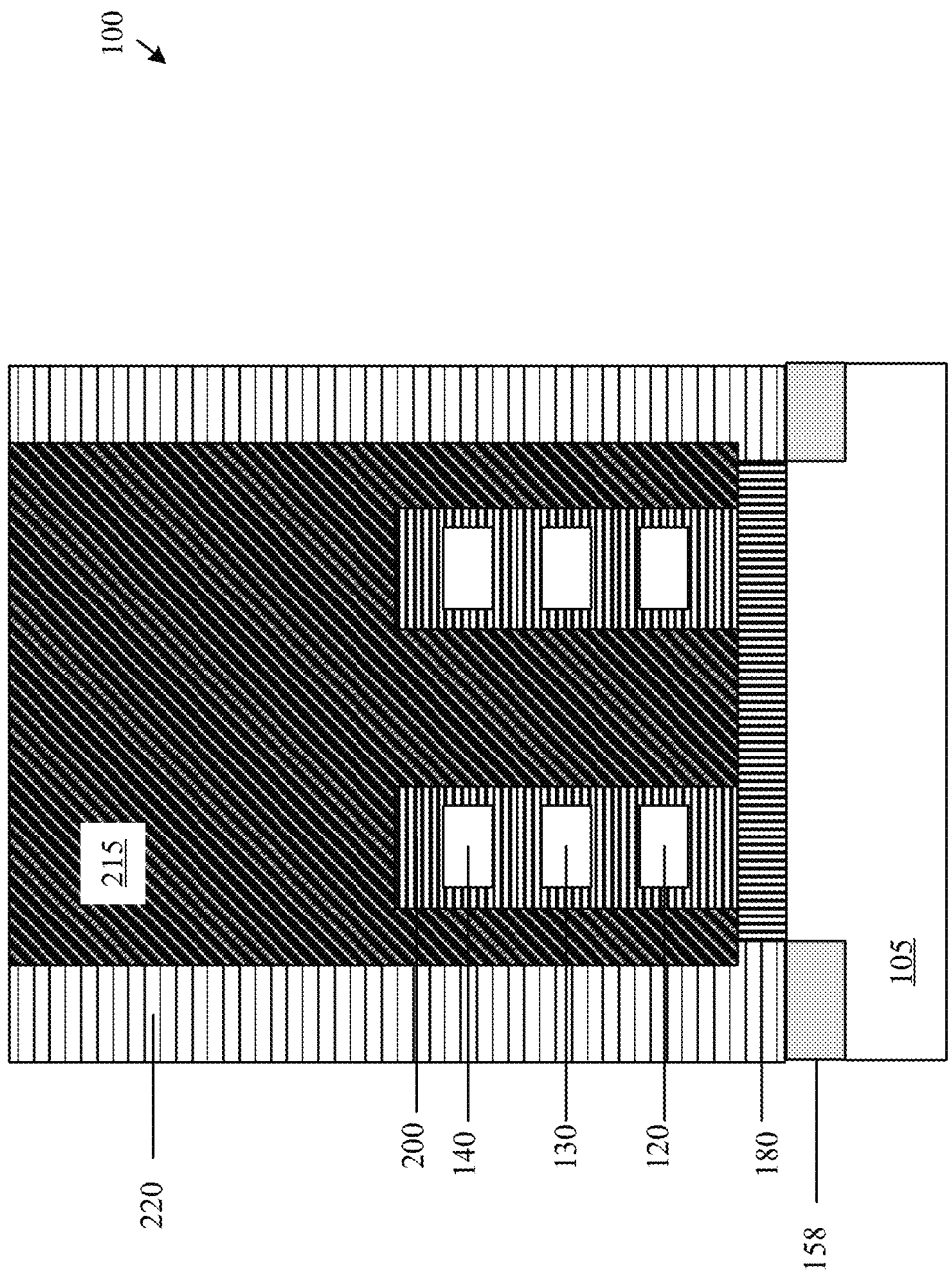
FIG. 23 illustrates cross section C of the nano device after the formation of gate, the gate cap, and the contact, in accordance with the embodiment of the present invention.

Referring now to FIGS. 21, 22, and 23, the nano device 100 is shown/illustrated after the formation of gate 205, the gate cap 210, and the contact 215, in accordance with the embodiment of the present invention. FIG. 21 illustrates cross section A of the nano device 100, FIG. 22 illustrates cross section B of the nano device 100, FIG. 23 illustrates cross section C of the nano device 100. The sacrificial layers (e.g., the second layer 115, the fourth layer 125, the sixth layer 135, and the eighth layer 145), the dummy gate 160 and the third hardmask 165 are removed. A gate 205 is formed in the empty space created by the removal of these layers. The gate 205 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. As seen by FIG. 22, the gate 205 encapsulate portions of the nanosheets (e.g., the third layer 120, the fifth layer 130, and the seventh layer 140). A gate cap 210 is formed on top of the gate 205. A contact 215 is formed on top of the source/drain epitaxy 200 in some sections of the nano device (as illustrated by FIG. 21) and encapsulates the source/drain epitaxy 200 in ladder rung sections of the nano device (as illustrated by FIG. 23). An interlayer dielectric 220 was formed on top of the shallow trench isolation layer 180 and the contact 215 is formed within interlayer dielectric 220. The contact 215 encapsulates the source/drain epitaxy 200, such that, the contact 215 is in direct contact with three sides of the source/drain epitaxy 200. Thus, the nano contacts/wires (e.g., the thinned sections of the third layer 120, the fifth layer 130, and the seventh layer 140) and the source/drain epitaxy 200 create pathways through the contact 215.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor device comprising:
    a first nanosheet channel and a second nanosheet channel located on a substrate;
    a nanowire connecting the first nanosheet channel to the second nanosheet channel, wherein dimensions of the nanowire are different than dimensions of the first and second nanosheet channels, wherein the nanowire is integrally formed with the first and second nanosheet; and
    a source/drain epitaxy located on the nanowire.

2. The semiconductor device claim 1, wherein the nanowire is in the same horizontal plane as the first nanosheet channel and the second nanosheet channel.

3. The semiconductor device of claim 2, wherein the source/drain encloses the nanowire.

4. The semiconductor device of claim 3, further comprising:
    a contact located on the source/drain epitaxy.

5. The semiconductor device of claim 4, wherein the contact is in direct contact with three sides of the source drain epitaxy.

6. The semiconductor device of claim 4, further comprising:
    a top spacer located adjacent to the contact;
    a hardmask layer located adjacent to the contact, wherein the hardmask layer is located under the top spacer.

7. The semiconductor device of claim 6, further comprising:
    a first inner spacer located on the first nanosheet; and
    a second inner spacer located on the second nanosheet;
    wherein the source/drain epitaxy is located between the first inner spacer and the second inner spacer.

8. The semiconductor device comprising:
    a source/drain epitaxy located under a contact, wherein the source/drain epitaxy has a cross-bar shape;
    a first nanosheet channel and a second nanosheet channel are located on a substrate;
    a nanowire connecting the first nanosheet channel to the second nanosheet channel, wherein dimensions of the nanowire are different than dimensions of the first and second nanosheet channels, wherein the nanowire is integrally formed with the first and second nanosheet, wherein the source/drain epitaxy located on the nanowire.

9. The semiconductor device claim 8, wherein the nanowire is in the same horizontal plane as the first nanosheet channel and the second nanosheet channel.

10. The semiconductor device of claim 9, wherein the source/drain encloses the nanowire.

11. The semiconductor device of claim 8, wherein the contact is in direct contact with three sides of the source drain epitaxy.

12. The semiconductor device of claim 11, further comprising:
    a top spacer located adjacent to the contact;
    a hardmask layer located adjacent to the contact, wherein the hardmask layer is located under the top spacer.

13. The semiconductor device of claim 12, further comprising:
    a first inner spacer located on the first nanosheet; and
    a second inner spacer located on the second nanosheet;
    wherein the source/drain epitaxy is located between the first inner spacer and the second inner spacer.

14. A semiconductor device comprising:
    a first nanosheet channel and a second nanosheet channel located on a substrate;

a nanowire connecting the first nanosheet channel to the second nanosheet channel, wherein dimensions of the nanowire are different than dimensions of the first and second nanosheet channels, wherein a common top surface extends across the first nanosheet channel, the second nanosheet channel, and the nanowire; and a source/drain epitaxy located on the nanowire.

15. The semiconductor device claim 14, wherein the nanowire is in the same horizontal plane as the first nanosheet channel and the second nanosheet channel.

16. The semiconductor device of claim 15, wherein the source/drain encloses the nanowire.

17. The semiconductor device of claim 16, further comprising:

a contact located on the source/drain epitaxy.

18. The semiconductor device of claim 17, wherein the contact is in direct contact with three sides of the source drain epitaxy.

19. The semiconductor device of claim 17, further comprising:

a top spacer located adjacent to the contact;

a hardmask layer located adjacent to the contact, wherein the hardmask layer is located under the top spacer.

* * * * *